(12) United States Patent
Krauss

(10) Patent No.: US 7,821,754 B2
(45) Date of Patent: Oct. 26, 2010

(54) CIRCUIT ARRANGEMENT FOR PRODUCING A DEFINED OUTPUT SIGNAL

(75) Inventor: Mathias Krauss, Centerport, NY (US)

(73) Assignee: Zentrum Mikroelektronik Dresden AG, Dresden (DE)

( * ) Notice: Subject to any disclaimer, the term of this patent is extended or adjusted under 35 U.S.C. 154(b) by 201 days.

(21) Appl. No.: 12/063,474

(22) PCT Filed: Aug. 11, 2006

(86) PCT No.: PCT/DE2006/001412

§ 371 (c)(1),
(2), (4) Date: Nov. 13, 2008

(87) PCT Pub. No.: WO2007/016923

PCT Pub. Date: Feb. 15, 2007

(65) Prior Publication Data

US 2009/0302907 A1 Dec. 10, 2009

(30) Foreign Application Priority Data

Aug. 11, 2005 (DE) ...................... 10 2005 038 316

(51) Int. Cl.
*H02H 3/24* (2006.01)
(52) U.S. Cl. ........................... 361/92; 327/88; 340/652; 324/537; 324/555
(58) Field of Classification Search ............ 327/77–89, 327/540, 541; 324/537, 555, 771; 340/652, 340/653; 361/18, 88, 92
See application file for complete search history.

(56) References Cited

U.S. PATENT DOCUMENTS

| 4,612,453 | A | | 9/1986 | Yamazaki |
| 5,473,253 | A | * | 12/1995 | Araki ......................... 324/537 |
| 5,877,635 | A | | 3/1999 | Lin |
| 6,643,111 | B1 | * | 11/2003 | Motz et al. ................. 361/91.1 |
| 6,650,156 | B1 | | 11/2003 | Reid et al. |
| 2002/0089382 | A1 | | 7/2002 | Yang |

FOREIGN PATENT DOCUMENTS

DE    4400437 C2    7/1994
DE    100 08 180 C2    1/2001

OTHER PUBLICATIONS

The International Search Report for PCT/DE2006/001412, filed Jan. 30, 2007.

* cited by examiner

*Primary Examiner*—Lincoln Donovan
*Assistant Examiner*—Patrick O'Neill
(74) *Attorney, Agent, or Firm*—Heslin Rothenberg Farley & Mesiti P.C.

(57) ABSTRACT

A circuit arrangement for producing a defined output signal in CMOS integrated circuit is provided in which the output of a sensor signal conditioning circuit is connected to the drain terminal of a first N channel depletion transistor, to a source terminal of a second N channel depletion transistor and to the output (OUT) of an integrated CMOS circuit. The gate terminals of the first and second N channel depletion transistors are connected to the output (VP) of a control circuit and the first terminal of a discharge resistance. The second terminal of the discharge resistance and the source terminal of the first N channel depletion transistor are connected to a potential VSS, and the drain terminal of the second N channel depletion transistor is connected to a potential VDD.

4 Claims, 1 Drawing Sheet

Figure 1:
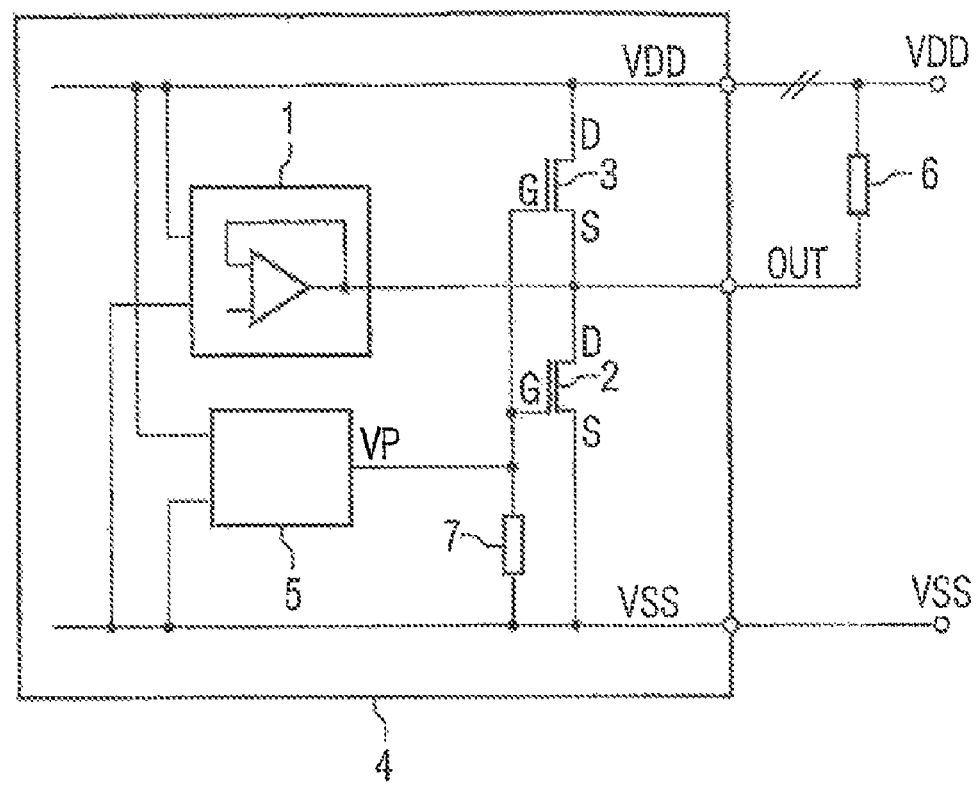

CIRCUIT ARRANGEMENT FOR PRODUCING
A DEFINED OUTPUT SIGNAL

CROSS REFERENCE TO RELATED APPLICATIONS

This application is a national stage filing under section 371 of International Application No. PCT/DE2006/001412, filed on Aug. 11, 2006, and published in German on Feb. 15, 2007, as WO 2007/016923 A2 and claims priority of German application No. 10 2005 038 316.5 filed on Aug. 11, 2005, the entire disclosure of these applications being hereby incorporated herein by reference.

BACKGROUND ART

The invention relates to a circuit arrangement for generating a defined output signal in a CMOS circuit, comprising a sensor signal conditioning switch with an output to emit an output signal, where the output is connected to a first connection of a load resistor and the second connection of the load resistor is connected to a VDD potential.

In addition, the invention relates to a circuit arrangement for generating a defined output signal in a CMOS circuit comprising a sensor signal conditioning switch with an output to emit an output signal, where the output is connected to a first connection of a load resistor and the second connection of the load resistor is connected to a VSS potential.

Circuits for conditioning sensor signals are designed to transform the more or less error-prone raw signals of sensors into a standard output signal which is free of said errors. One of the frequently used standards is the ratiometric voltage output. It is used to transform the relevant range of the input signal, for example an angle sensor angle of 50 to 150 degrees or the pressure sensor pressure of 0 to 200 bar into an output voltage of for example 5% to 95% of the supply voltage.

The standard of the ratiometric voltage signal originates from simple potentiometric sensors. Compatibility requirements make it necessary that modern CMOS circuits behave exactly like their predecessors, the potentiometers, with respect to certain errors.

In particular, it is necessary that in the so-called "power loss" case, i.e. when one of the VDD and GND supply lines is interrupted, an output signal is generated in cooperation with the remaining connected load resistor in one of the so-called diagnostic ranges, namely below 2.5% or above 97.5% of the supply voltage.

When using a CMOS circuit without any external components, a special circuit design is required to comply with this behavior which occurs naturally in a potentiometer.

The solution corresponding to the state-of-the-art consists in the detection of the interruption of the supply voltage and to bring the circuit into a high-resistance status which makes is possible to generate an output voltage smaller than 2.5% of VDD in combination with a pull-down load resistor in case of "loss of VSS" or a supply voltage greater than 97.5% with a pull-up load resistor in case of "loss of VDD".

The issues described below must be taken into account for this purpose.

In order to achieve the diagnostic status, the diagnosis switch as component of the circuit must continue to perform certain functions while the supply voltage connections are interrupted. Before the supply voltage drops below a certain value due to the voltage requirements of the circuit, the whole circuit must have been switched into power-down status to ensure the supply of the circuit via load resistor and parasitic substrate or tank diodes. Mastering this switching process under different framework conditions such as load resistor size and load capacity and essentially undefined flank development of the interruption is a technical challenge.

The realization of the power-down status with extremely low residual voltage for the whole circuit requires special technical procedures in each individual switching block which in part can only be achieved at the expense of the overall error budget of critical analogous switching parts. In addition, the linkage of the diagnosis switch with all switching parts represents an additional design risk for the proper functioning of all other control procedures which should not be underestimated.

Under real conditions, in particular when used in an automobile, the secure maintenance of the residual power-down voltage below a value which ensures compliance with the diagnosis levels (<2.5% VDD or >97% VDD) even for temperatures of 150° C. and more, is problematic. To manage this problem, a maximum limit needs to be specified for the load resistor which is generally uncommon; in the practice, this limits the application range of the circuit.

BRIEF SUMMARY OF INVENTION

Therefore, it is the objective of the invention to provide a circuit arrangement for the generation of a defined output signal in a CMOS circuit which allows the robust diagnosis of the interruption of the VDD or GND connection which is essentially independent from the remaining circuit, and which neither requires a maximum limit of the load resistor nor limits the maximum operating temperature of the circuit and which can be realized directly on the chip.

Pursuant to the invention, the objective of a circuit arrangement for generating a defined output signal of the type mentioned above is solved in that the output of the sensor signal conditioning switch is connected to a drain connection of a first N-channel depletion transistor, a source connection of a second N-channel depletion transistor and the output (OUT) of the CMOS circuit, that the gate connection of the first and second N-channel depletion transistors is connected to an output (VP) of a control switch and a first connection of a shunt resistor, that a second connection of the shunt resistor and a source connection of the first N-channel depletion transistor are connected to the VSS potential and that a drain connection of the second N-channel depletion transistor is connected to the VDD potential.

The nature of the invention is explained based on a CMOS process with P-substrate and N-tank. Based on the invention, a first N-channel depletion transistor is connected to the output OUT of the circuit with its drain connection, to the negative operating voltage VSS with its source connection and to the output VP of a control switch with its gate connection. Moreover, a second N-channel depletion transistor is connected to VDD with its drain connection, to the output OUT with its source connection and to the output VP of the control switch with its gate connection. The control switch is a charging pump providing negative voltage compared to VSS at its output VP, which is greater with respect to the amount than the amount of negative threshold voltage of the two N-channel depletion transistors. Based on the invention, a high-resistance resistor connects the output VP of the control switch to the VSS potential.

BRIEF DESCRIPTION OF THE DRAWING FIGURES

The invention is explained in more detail below based on two exemplary embodiments. The associated figures show FIG. 1 The circuit arrangement according to the invention with a pull-up load resistor and FIG. 2 The circuit arrangement according to the invention with a pull-down load resistor.

DETAILED DESCRIPTION

FIG. 1 illustrates the circuit arrangement according to the invention working with a pull-up load resistor.

The circuit arrangement comprises the actual sensor switch 1, which is for example a pressure or temperature sensor connected to VDD and VSS operating voltages or a mass potential and which comprises an output OUT to emit an output signal which in the majority of cases is ratiometric. A load resistor 6 is connected the output OUT as illustrated either as pull-down resistor against the VSS potential or as pull-up resistor against the VDD potential.

A first N-channel depletion transistor 2 is connected to the output OUT of the circuit 4 with its drain connection to the negative operating voltage VSS with its source connection and to the output VP of a control switch 5 with its gate connection. A shunt resistor 7 is arranged between the output VP of the control switch 5 and the VSS potential. In an overview of the operating current connection VDD illustrated in FIG. 1, the transistor 2 connects the output OUT to the VSS potential inside or outside the circuit 4.

In case the load resistor 6 is designed as a pull-up resistor, the load resistor 6 and the low-resistance N-channel depletion transistor 2 form a voltage divider which generates an output voltage of <2.5% of VDD at the output OUT, which simultaneously represents decreasing voltage across the whole circuit; as a result, the control switch 5 is no longer operable and the shunt resistor 7 connects the gate of the N-channel depletion transistor 2 to VSS. This is possible, because the N-channel depletion transistor 2 is self-conductive without any control voltage at the gate.

Figure 2:
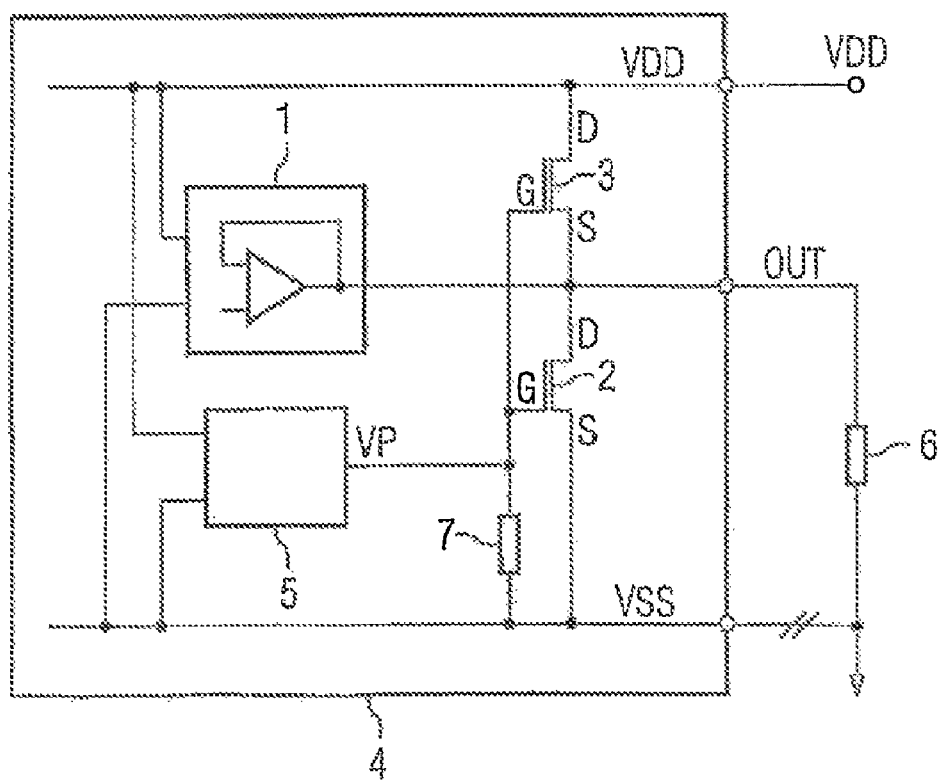

FIG. 2 illustrates a circuit arrangement according to the invention which is equipped with a pull-down resistor. The design of this circuit is identical to the one described above.

For this example, it is assumed that the VSS line is interrupted inside or outside the sensor signal conditioning switch 1.

The second N-channel depletion transistor 3 is connected to VDD with its drain connection, to the output OUT with its source connection and to the output VP of the control switch 5 with its gate connection. As illustrated in an overview of the VSS voltage line, this transistor connects the output OUT to the VDD potential.

If the load resistor 6 is a pull-down resistor, said load resistor 6 and the low-resistance second N-channel depletion transistor 3 form a voltage divider, where an output voltage of >97.5% of the VDD potential is generated at the output OUT of the arrangement. This is possible because the N-channel depletion transistor 3 is self-conducting without any control voltage at the gate. The difference of this voltage with VDD at the same time represents the decreasing voltage across the whole circuit; as a result, the control switch 5 is no longer operable and the shunt resistor 7 connects the gate of the second N-channel depletion transistor 3 to the now open VSS connection of the IC.

Therefore, no part of the circuit 4 is active and the self-conducting N-channel depletion transistors 2 and 3 guarantee the specified diagnosis levels in both diagnostic cases, provided the dimensions are appropriate. To comply with these levels, a minimum limit for the load resistor 6 needs to be specified, as it is generally provided with the limited driver capacity of the output buffer. The control switch 5 is designed as a charging pump. It provides negative voltage at its output VP compared to the VSS potential. The amount of said voltage is greater than the amount of the negative threshold voltage of the two N-channel depletion transistors. Accordingly, during regular operation, the secure disabling of N-channel depletion transistors 2 and 3 is guaranteed, thus effectively preventing an additional load of the output buffer of the sensor signal conditioning switch 1.

The invention claimed is:

1. Circuit arrangement for generating a defined output signal in a CMOS circuit, comprising a sensor signal conditioning switch with an output to emit an output signal, wherein the output is connected to a first connector of a load resistor and a second connector of the load resistor is connected to a VDD potential, the output of the sensor signal conditioning switch is connected to a drain connection of a first N-channel depletion transistor, a source connection of a second N-channel depletion transistor and an output of the CMOS circuit, a gate connection of the first and the second N-channel depletion transistors are connected to an output of a control switch and a first connection of a shunt resistor, a second connection of the shunt resistor and a source connection of the first N-channel depletion transistor are connected to a VSS potential, and a drain connection of the second N-channel depletion transistor is connected to the VDD potential.

2. Arrangement according to claim 1, wherein the control switch comprises a charging pump.

3. Circuit arrangement for generation of a defined output signal in a CMOS circuit comprising a sensor signal conditioning switch with an output to emit an output signal, wherein the output is connected to a first connection of a load resistor and a second connection of the load resistor is connected to a VSS potential, the output of the sensor signal conditioning switch is connected to a drain connection of a first N-channel depletion transistor, a source connection of a second N-channel depletion transistor and an output of the CMOS circuit, that the gate connections of the first and the second N-channel depletion transistors are connected to an output of a control switch and a first connection of a shunt resistor, a second connection of the shunt resistor and a source connection of the first N-channel depletion transistor are connected to a VSS potential, and a drain connection of the second N-channel depletion transistor is connected to a VDD potential.

4. Arrangement according to claim 3, wherein the control switch comprises a charging pump.

\* \* \* \* \*